United States Patent [19]
Strauss

[11] Patent Number: 5,559,659
[45] Date of Patent: Sep. 24, 1996

[54] ENHANCED RC COUPLED ELECTROSTATIC DISCHARGE PROTECTION

[75] Inventor: Mark S. Strauss, Allentown, Pa.

[73] Assignee: Lucent Technologies Inc., Murray Hill, N.J.

[21] Appl. No.: 410,427

[22] Filed: Mar. 23, 1995

[51] Int. Cl.$^6$ .................................................... H02H 9/04
[52] U.S. Cl. ........................... 361/56; 361/91; 361/111; 361/118
[58] Field of Search ............................ 361/56, 91, 111, 361/118; 307/540

[56] References Cited

U.S. PATENT DOCUMENTS

| | | | |
|---|---|---|---|
| 4,766,334 | 8/1988 | Warner | 307/540 |
| 5,255,146 | 10/1993 | Miller | 361/56 |

*Primary Examiner*—Jeffrey A. Gaffin
*Assistant Examiner*—Stephen Jackson
*Attorney, Agent, or Firm*—James H. Fox

[57] ABSTRACT

An integrated circuit ESD protection technique includes a protection circuit having a series resistor-capacitor circuit connected between power supply bondpads. The resistor-capacitor circuit provides a desired time constant for control of active drive circuitry that controls a protective transistor also connected between the bondpads. The time constant is chosen to be short enough to prevent conduction of the protective transistor during normal operation and power-up, while still allowing conduction of the protective transistor during the initial phase of an ESD event. A feedback resistor is connected in parallel with the active circuitry, thereby lengthening the time that the protective transistor conducts during an ESD event. In this manner, the ESD current is more completely conducted through the protective circuitry, so that the level of protection is increased.

7 Claims, 1 Drawing Sheet

5,559,659

ENHANCED RC COUPLED ELECTROSTATIC DISCHARGE PROTECTION

BACKGROUND OF THE INVENTION

Field of the Invention

The present invention relates to an integrated circuit having electrostatic discharge (ESD) protection.

Description of the Prior Art

Integrated circuits (ICs) are protected against damage due to electrostatic discharge by a variety of circuit and processing techniques. For example, the use of input diodes or transistors to clamp the voltage at an input, output, or power supply bondpad is well known. One form of ESD protection circuit involves the use of a transistor controlled by a resistance-capacitance (RC) circuit for shunting the flow of ESD current between the protected bondpad and a power supply bondpad ($V_{DD}$ or $V_{SS}$). Examples are shown in FIGS. 1 and 2 of U.S. Pat. No. 5,345,357 co-assigned herewith.

Another example is shown in FIG. 1 herein, wherein resistor 10, capacitor 11 and inverters 12, 13 and 14 form a trigger circuit for protective transistor 15. The trigger circuit causes transistor 15 to conduct when the voltage on $V_{DD}$ bondpad 16 rises relative to the $V_{SS}$ bondpad 17 faster than approximately the RC time constant set by 10 and 11. This is because the very rapid voltage rise due to an ESD event causes inverters 12, 13 and 14 to become active, since they also receive power supply voltages through the bondpads (connections not shown for simplicity), while capacitor 11 holds node 18 below the switching threshold of inverter 12. This causes invention 14 to place a high voltage on the gate of transistor 15. That allows transistor 15 to conduct the ESD current from bondpad 16 to bondpad 17, thereby protecting other circuitry (not shown) on the integrated circuit from an excessively high ESD voltage. The time that the circuit is active is approximately the RC time constant set by resistor 10 and capacitor 11. In normal power-up of the circuit, the voltage rise is relatively slow, and node 18 is pulled high through resistor 18 sufficiently rapidly to prevent protective transistor 15 from conducting.

SUMMARY OF THE INVENTION

I have invented an integrated circuit ESD protection technique wherein a protection circuit that includes a series resistor-capacitor circuit having a common node is connected between power supply bondpads. The common node is connected to active drive circuitry that drives a protective transistor also connected between the bondpads. A feedback device, typically a resistor, is connected in parallel with a non-inverting portion of the active drive circuitry.

DETAILED DESCRIPTION

Figure 1:
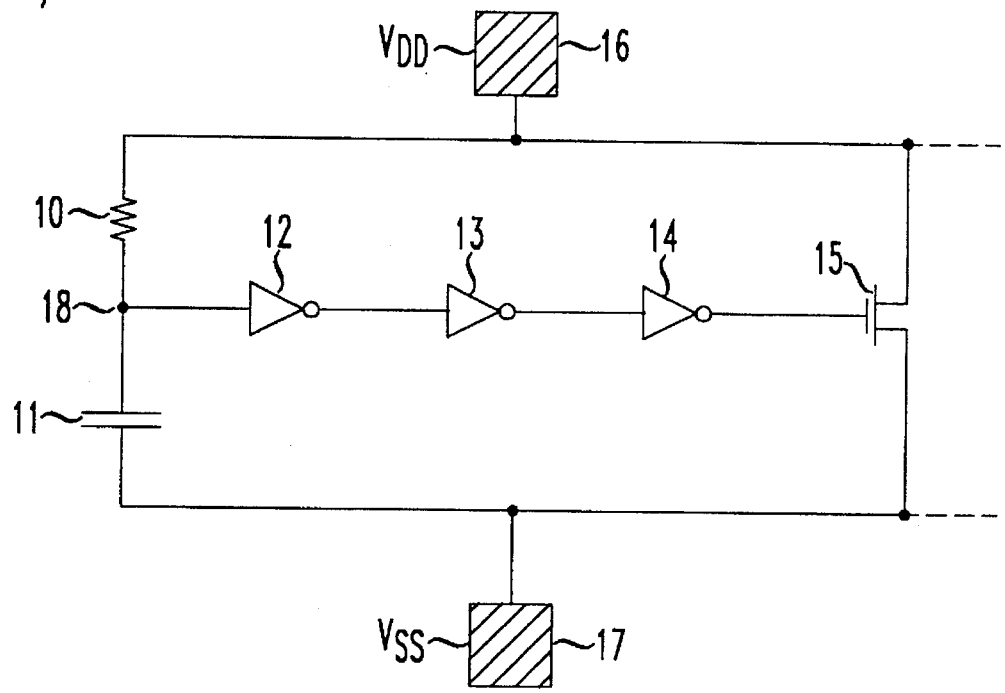
FIGS. 1 shows a prior-art ESD protection circuit.

The following detailed description relates to an integrated circuit having an improved ESD protection circuit. I have determined that the circuitry of FIG. 1 may not be sufficient to protect circuitry on the integrated circuit from damage due to an ESD event, or may cause, undesirable transient currents during normal operation. For example, if the RC time constant is short, the voltage on node 18 rises rapidly as the ESD voltage initially rises. This rapid rise in voltage at node 18 may cause the protective transistor 15 to cease conduction before the ESD event has dissipated a significant portion of its energy. Therefore, the other circuitry on the integrated circuit is left to dissipate this energy, often resulting to damage to the operational portion of the integrated circuit. On the other hand, if the RC time constant is long, then noise signals on the power supply during normal operation may inadvertently trigger the protective circuitry, causing undesirable transient currents between the power supply bondpads.

Figure 2:
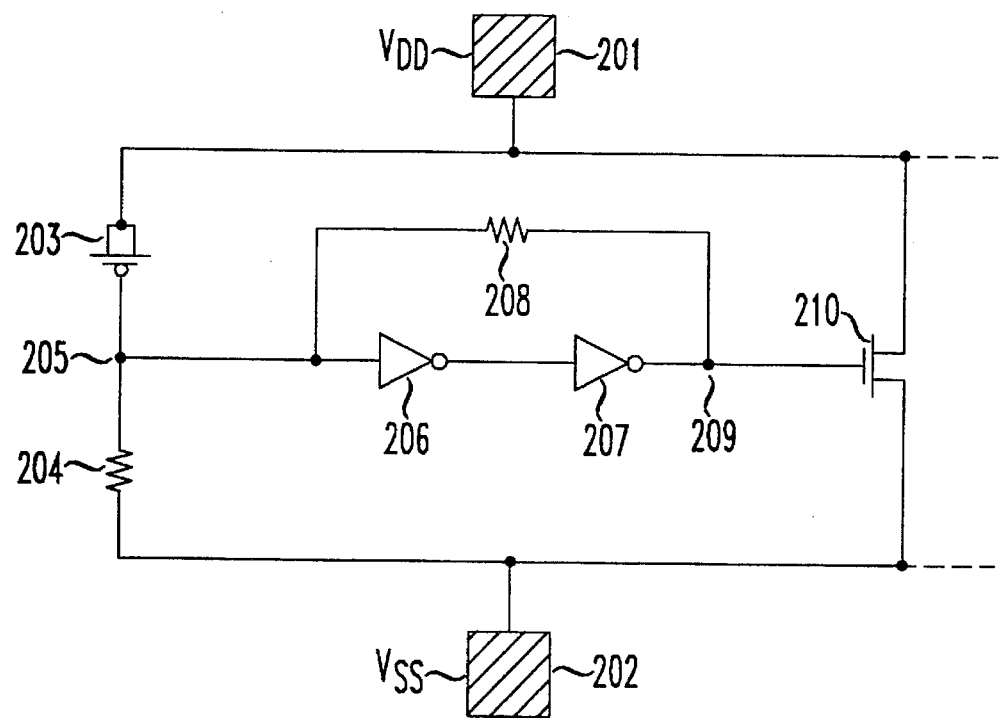
FIG. 2 shows an exemplary embodiment of the invention.

Referring to FIG. 2, an improved protective circuit is shown connected between the $V_{DD}$ bondpad 201 and the $V_{SS}$ bondpad 202. The circuit includes an RC network having capacitor 203 connected between $V_{DD}$ bondpad 201 and common node 205, and resistor 204 connected between $V_{SS}$ bondpad 202 and common node 205. The common node 205 also connects to the input of invert 206 which in turn drives inverter 207 that drives protective transistor 210. In operation, a positive-voltage ESD event on bondpad 201 with respect to bondpad 202, or alternatively a negative-voltage ESD event on bondpad 202 with respect to bondpad 201, causes a rapid rise in the voltage on node 205, due to conduction through capacitor 203. This in turn causes the output of inverter 206 to go low, and hence the output of inverter 207 goes high, thereby allowing transistor 210 to conduct ESD current from bondpad 201 to bondpad 202. Note that the inverters 206 and 207 are likewise powered via the bondpads 201 and 202 through connections not shown, as above. The RC time constant of 203 and 204 is chosen is chosen to be approximately equal to the risetime of the ESD waveform, typically less than 10 nanoseconds. This sets the active drive circuitry so that transistor 210 conducts. Conduction does not occur during a normal power-up operation, when the voltage on the bondpad 201 rises relatively more slowly (typically tens of microseconds or longer) with respect to the voltage on bondpad 202 than the RC time constant set by capacitor 203 and resistor 204. Hence, in normal circuit operation when DC voltages are present on the bondpads 201,202, the resistor 204 holds node 205 low, so that conduction of the protective transistor 210 is prevented.

To ensure that the protective transistor remains conductive for a period of time after the initial rise of the ESD voltage, the inventive circuitry includes feedback resistor 208. This resistor connects from the output of inverter 207 (node 209) back to the input of inverter 206 (node 205). When the voltage on node 209 is high, the resistor 208 tends to hold the voltage on node 205 high. Therefore, the inverter 206 maintains a low output, and inverter 207 maintains a high output, for a longer period of time after the initial rise of the ESD voltage than the prior-art circuit of FIG. 1. In practice, inverter 207 maintains its high output for the duration of the ESD event. This allows protective transistor 210 to conduct more of the potentially damaging ESD current from bondpad 201 to bondpad 202. Eventually the protective transistor 210 returns to a state of non-conduction as the ES D voltage falls below a certain level. In practice, as implemented in present-day 0.5 micron CMOS technology, I have found a value of 380 ohms for resistor 208 to be suitable. Capacitor 203 has a typical value of 2.5 picofarads and resistor 204 having a value of 2300 ohms, providing a time constant of 5.6 nanoseconds. For typical ESD protection in sub-micron CMOS circuitry, I recommend an RC time constant in the range of 0.5 to 50 nanoseconds, depending in part on the $V_{DD}$ to $V_{SS}$ capacitance of the integrated circuit. The feedback resistor 208 has a typical value in the range of from 200 to 2000 ohms, with a wider range being possible.

Although the above, implementation has been given for CMOS circuitry, the present invention may be practiced in bipolar, or bipolar-CMOS (e.g., BICMOS) circuitry. Furthermore, while two inverters are shown in the illustrative embodiment of FIG. 2, any even number of inverters will provide positive feedback through a resistor. Hence, the drive circuitry connected to the feedback resistor is noninverting, even though inverters may be used in implementing it, as will be apparent to persons of skill in the art. If it desirable to use an odd number of inverters and an n-channel protective transistor, then the capacitor in the RC network connects $V_{SS}$ and the resistor connects to $V_{DD}$. The feedback resistor then connects the output of the second inverter to the input of the first inverter at the common node, thereby providing positive feedback. On the other hand, if it is desired to use a protective transistor of opposite conductivity type (e.g., p-channel) than the protective transistor shown (n-channel), then three inverters may be used with a single inverter following the non-inverting (e.g., two-inverter) portion of the drive circuitry that is connected to the feedback resistor, in which case the RC network is connected as shown in FIG. 2. Although the capacitor 203 is illustrated as a p-MOS device, other types of capacitors may alternatively be used. Furthermore, while a resistor has been shown as the feedback device, other resistive devices may be used. For example, a transistor connected as a resistor may be obtained by connecting the gate of an n-channel transistor to the $V_{DD}$ bondpad, and connecting the source/drain regions to the output of the second inverter and the input of the first inverter.

The invention claimed is:

1. An integrated circuit including a protective transistor connected between a first power supply bondpad and a second power supply bondpad, and a drive circuit for causing said protective transistor to conduct during an electrostatic discharge event and to not conduct during normal operation of the integrated circuit, characterized in that said drive circuit includes a noninverting portion controlled by a resistor-capacitor series circuit connected between the first and second bondpads and providing an RC time constant, and further characterized in that a feedback device is provided to extend the conduction of said protective transistor beyond the time provided by the RC time constant of the resistor-capacitor series circuit.

2. The integrated circuit of claim 1 wherein said series circuit comprises a capacitor connected between said common node and a positive power supply ($V_{DD}$) bondpad, and a resistor connected between said common node and a negative power supply ($V_{SS}$) bondpad, and wherein said protective transistor is an n-channel transistor.

3. An integrated circuit including a protection circuit having a resistor-capacitor series circuit having a common node and connected between power supply bondpads, characterized in that the common node is connected to active drive circuitry that drives a protective transistor also connected between the bondpads, and wherein a feedback resistor is connected from the output to the input of a noninverting portion of the drive circuitry in order to extend the conduction of said protective transistor beyond provided by the the RC time constant of the resistor-capacitor series circuit.

4. The integrated circuit of claim 3 wherein said noninverting portion of the drive circuitry comprises a first inverter having an output connected to the input of a second inverter.

5. The integrated circuit of claim 3 wherein said protective transistor is an n-channel field effect transistor.

6. The integrated circuit of claim 3 wherein said protective transistor is a p-channel field effect transistor, and said active drive circuitry includes three inverters.

7. The integrated circuit of claim 3 wherein said series circuit comprises a capacitor connected between said common node and a positive power supply ($V_{dd}$) bondpad, and a resistor connected between said common node and a negative power supply ($V_{ss}$) bondpad, and wherein said protective transistor is an n-channel transistor.

* * * * *